United States Patent
Chen et al.

(10) Patent No.: US 9,859,323 B1
(45) Date of Patent: Jan. 2, 2018

(54) COMPLEMENTARY METAL-OXIDE-SEMICONDUCTOR (CMOS) IMAGE SENSOR

(71) Applicant: Taiwan Semiconductor Manufacturing Co., Ltd., Hsin-Chu (TW)

(72) Inventors: Sheng-Chau Chen, Tainan (TW); Cheng-Hsien Chou, Tainan (TW); Cheng-Yuan Tsai, Chu-Pei (TW); Sheng-Chan Li, Tainan (TW); Zhi-Yang Wang, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/180,395

(22) Filed: Jun. 13, 2016

(51) Int. Cl.
*H01L 31/062* (2012.01)
*H01L 31/113* (2006.01)
*H01L 27/146* (2006.01)

(52) U.S. Cl.
CPC .... *H01L 27/14643* (2013.01); *H01L 27/1462* (2013.01); *H01L 27/1463* (2013.01); *H01L 27/1464* (2013.01); *H01L 27/14621* (2013.01); *H01L 27/14627* (2013.01); *H01L 27/14629* (2013.01); *H01L 27/14685* (2013.01); *H01L 27/14689* (2013.01)

(58) Field of Classification Search
USPC ....... 257/290–292, 215, 184, 222, 226, 233, 257/234, 258, 461–466, 501, 509, 510, 257/512, 513, 544; 438/29, 42, 121, 144, 438/145, 195, 196, 218, 221
See application file for complete search history.

(56) References Cited

U.S. PATENT DOCUMENTS

| | | | |
|---|---|---|---|
| 7,148,525 B2* | 12/2006 | Mouli | H01L 27/1463 257/233 |
| 9,263,486 B2* | 2/2016 | Wu | H01L 27/14623 |
| 2014/0361355 A1* | 12/2014 | Shin | H01L 27/1463 257/292 |

* cited by examiner

*Primary Examiner* — Sonya D McCall Shepard
(74) *Attorney, Agent, or Firm* — Eschweiler & Potashnik, LLC

(57) ABSTRACT

A complementary metal-oxide-semiconductor (CMOS) image sensor having a passivation layer is provided. The CMOS image sensor includes a sensing device substrate. Isolation structures are positioned within trenches of the sensing device substrate. The isolation structures are arranged along opposing sides of a plurality of image sensing devices. The CMOS image sensor also includes a passivation layer. The passivation layer includes passivation sidewalls arranged along the sidewalls of the isolation structures. A metallic grid overlies the passivation layer. The metallic grid includes a metal framework surrounding openings overlying the plurality of image sensing devices. The passivation layer further includes passivation section underlying the openings.

20 Claims, 6 Drawing Sheets

COMPLEMENTARY METAL-OXIDE-SEMICONDUCTOR (CMOS) IMAGE SENSOR

BACKGROUND

Many modern day electronic devices comprise image sensors. Some types of image sensors include charge-coupled device (CCD) image sensors and complementary metal-oxide-semiconductor (CMOS) image sensors. Compared to CCD image sensors, CMOS image sensors are increasingly favored. CMOS image sensors provide lower power consumption, smaller size, and faster data processing than CCD image sensors. Further, CMOS image sensors provide a direct output of data that is not available in CCD image sensors. Even more, CMOS image sensors have a lower manufacturing cost compared to CCD image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
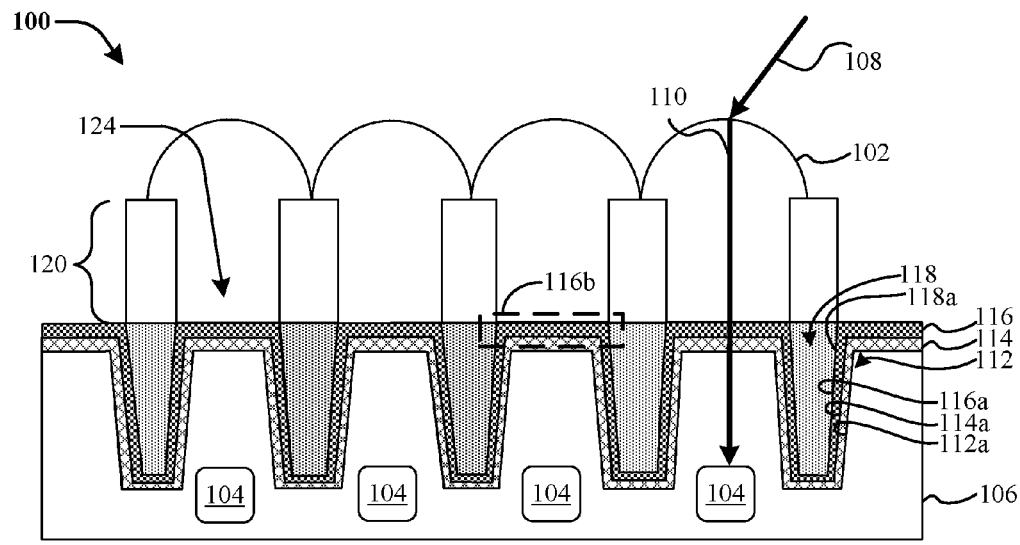
FIG. 1 illustrates a cross-sectional view of some embodiments of a complementary metal-oxide-semiconductor (CMOS) image sensor.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Complementary metal-oxide-semiconductor (CMOS) image sensors comprise image sensing devices. For example, the image sensing devices may be photodetectors or pixel sensors arranged in a semiconductor layer of the CMOS image sensor. Microlenses are arranged on a surface of the semiconductor layer overlying the image sensing devices such that light passes through a microlens and is guided to strike an image sensing device. The distance between the microlens and the image sensing devices is defined as the optical path length of the light in the CMOS image sensor, which corresponds to the thickness of the layers of the CMOS image sensor. A long optical path length can adversely affect the operation of the CMOS image sensor. For example, the longer the optical path length, the lower the signal-to-noise ratio (SNR) of the CMOS image sensor which also reduces the lux of the light striking the image sensing device.

However, merely reducing the thickness of the typical layers of a CMOS image sensor to reduce the optical path length can cause any number of problems. For example, CMOS image sensors often comprise a buffer oxide layer arranged below an array of color filters. The buffer oxide layer has a relatively large thickness, which gives the buffer oxide layer a structural strength to support the overlying optical features (e.g., microlenses, color filters, etc.). Therefore, merely thinning down existing layers may impair the operation of the CMOS image sensor or even cause the layers to crack and collapse under the weight of the overlying optical features.

The present disclosure relates to a CMOS image sensor having a passivation layer comprising a passivation material configured to support the overlying optical features with a relatively small thickness. For example, a relatively thick buffer oxide layer (e.g., a 1500-2000 angstrom thick buffer oxide layer) may be replaced with a thinner passivation layer being comprised of the passivation material. Using the thinner passivation layer reduces the overall thickness of the CMOS image sensor and consequently reduces the optical path length between the microlenses and the image sensing devices. Additionally, the passivation material may have optical properties that facilitate light striking the image sensing devices. In some embodiments, rather than the typical buffer oxide layer, the passivation layer may be deposited to angle radiation (e.g., light) toward the image sensing devices. For example, a thinner passivation layer may be able to stop chemical mechanical planarization (CMP) without necessitating the thick buffer oxide layer.

FIG. 1 illustrates a cross-sectional view of some embodiments of a complementary metal-oxide-semiconductor (CMOS) image sensor 100. The CMOS image sensor 100 includes optical features 102 and image sensing devices 104. The imaging sensing devices 104 are embedded in a sensing device substrate 106. When incident radiation 108 strikes an optical feature 102, the curvature of the optical feature 102 directs the incident radiation 108 toward an image sensing device 104 that corresponds to the optical feature 102. The distance between the optical feature 102 and the image sensing device 104 is defined as the optical path length 110 of the CMOS image sensor 100.

The sensing device substrate 106 has trenches 112 arranged between adjacent image sensing devices 104. The trenches 112 may be, for example, shallow trench isolation (STI) regions, implant isolation regions, and/or deep trench isolation (DTI) regions. The trenches 112 have trench sidewalls 112a that extend vertically from an uppermost surface of the sensing device substrate 106. In some embodiments, the angle of the trench sidewall 112a may be based on directing the incident radiation 108 to the image sensing device 104. Alternatively, the trench sidewalls 112a may be perpendicular to the uppermost surface of the sensing device substrate 106.

A high κ structure 114, comprising one or more high κ dielectric layers, overlies the sensing device substrate 106 and conforms to the trenches 112. For example, the high κ structure 114 is arranged on the uppermost surface of the sensing device substrate 106, such that the high κ structure sidewalls 114a extend along the trench sidewalls 112a. In one embodiment, the high κ structure 114 abuts the uppermost surface of the sensing device substrate 106. A passivation layer 116 overlies the high κ structure 114 and also conforms to the trenches 112. The passivation layer 116 may abut the high κ structure 114 such that passivation sidewalls 116a are in contact with the high κ structure sidewalls 114a.

The passivation layer 116 is formed from a passivation material. In one embodiment, the passivation layer is silicon nitride (e.g., $Si_3N_4$). The passivation material may be a material having optical properties that reflect the incident radiation 108 off the passivation sidewalls 116a to the image sensing devices 104. For example, in some embodiments, the passivation material may be selected to have a index of refraction that bends light exiting the optical feature 102 towards the image sensing devices 104 (e.g., the passivation material may have a greater index of refraction than the optical feature 102, so as to bend light towards a normal vector of the passivation material).

In some embodiments, the passivation material of the passivation layer 116 may be selected to have a thickness that is able to support the weight of the optical features 102 and be able to stop chemical mechanical planarization (CMP) during fabrication. For example, in some embodiments, the passivation layer 116 may have a thickness that is less than or equal to approximately 500 angstroms. In other embodiments, the passivation layer 116 may have a thickness that is less than or equal to approximately 250 angstroms. In other examples, the passivation layer 116 may have other thicknesses.

The trenches 112 further include isolation structures 118 that have isolation structure sidewalls 118a. Optical features 102 and image sensing devices 104 are positioned between adjacent isolation structures 118 such that an optical feature 102 directly underlies a corresponding image sensing device 104. The isolation structures 118 channel light through the CMOS image sensor 100 along the optical path 110 so that the incident radiation 108 reaches an image sensing device 104 vertically aligned with a corresponding optical feature 102 rather than an image sensing device 104 horizontally displaced from the optical feature 102. Accordingly, the passivation sidewalls 116a, corresponding to the isolation structure sidewalls 118a, reflect the incident radiation 108 toward the image sensing device 104 corresponding to the optical feature 102 through which the incident radiation 108 entered the CMOS image sensor 100.

A metallic grid 120 overlies the passivation layer 116. The metallic grid 120 includes a metal framework 122 that overlies the isolation structures 118. In some embodiments, the metal framework 122 contacts the isolation structures 118. The metal framework 122 surrounds openings 124 that form a placement for the optical features 102. In addition to the passivation sidewalls 116a, the passivation layer 116 includes passivation sections 116b underlying the openings 124.

Using a passivation layer 116 of a passivation material reduces the thickness of the CMOS image sensor 100 to reduce a length of the optical path 110, thereby improving operation of the CMOS image sensor 100. Furthermore, the passivation layer 116 may reflect the incident radiation 108 toward an image sensing device 104 which increases the lux of the incident radiation 108 striking the image sensing device.

Figure 2:
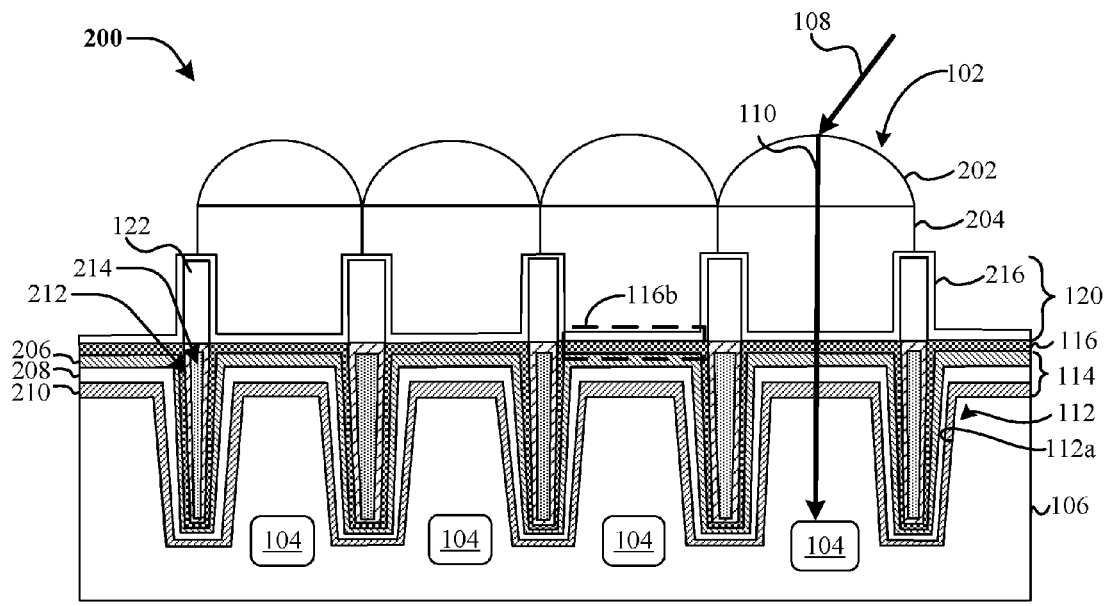
FIG. 2 illustrates a cross-sectional view of a detailed embodiment of the CMOS image sensor of FIG. 1.

FIG. 2 illustrates a cross-sectional view of a detailed embodiment of the CMOS image sensor of FIG. 1. The optical features 102 of the CMOS image sensor 200 include microlenses 202 and color filters 204. The microlenses 202 have a curved upper surface and a substantially flat bottom surface abutting the color filters 204. The curved upper surface is configured to focus the incident radiation 108 onto a center of an underlying image sensing device 104 to increase efficiency of the image sensing device 104. The color filter 204 selectively transmits an assigned color (e.g., a range of wavelengths of radiation) from the incident radiation 108 to the image sensing device 104. In some embodiments, a color filter 204 is configured to transmit radiation having a wavelength in a range of wavelengths, while blocking other wavelengths of radiation outside the range of wavelengths.

The incident radiation 108 may be reflected by the passivation layer 116 as it traverses the optical path 110. Underlying the passivation layer 116 is the high κ structure 114. As illustrated, the high κ structure 114 may include multiple layers: a first high κ dielectric layer 206, a second high κ dielectric layer 208, and an oxide layer 210. As shown, the first high κ dielectric layer 206 overlies the second high κ dielectric layer 208, which overlies the oxide layer 210. However, the layers of the high κ structure 114 may be formed in a different order. Furthermore, while the high κ structure 114 is shown having three layers, more or fewer layers may be included in the high κ structure 114.

In one embodiment, the first high κ dielectric layer 206 has a first dielectric constant, and the second high κ dielectric layer 208 has second dielectric constant. In one embodiment the first dielectric constant is different than the second dielectric constant. The oxide layer 210 may be slot plane antenna oxide. Likewise, the isolation structure 118 may have a layered structure. For example, the isolation structure may include an oxide shell 212 that surrounds a metallic core 214. In one embodiment the oxide shell 212 is an oxide structure and the metal core 214 is a tungsten structure.

In some embodiments, the isolation structure 118 is in contact with the metallic grid 120 at the metal framework 122. The upper surfaces of the isolation structures 118 are coplanar with the upper surfaces of the passivation layer 116. Because the oxide shell 212 surrounds the metallic core 214 of the isolation structure 118, the oxide shell 212 is in contact with the metal framework 122. Accordingly, upper surfaces of the oxide shell 212 are coplanar with an upper surface of the passivation sections 116b. However, in some embodiments, the oxide shell 212 abuts sidewalls and a lower surface of the metallic core 214, but does not abut the upper surface of the metallic core 214. Instead, the upper surfaces of the metallic core 214 are coplanar with an upper surface of the passivation sections 116b.

A metal layer 216 may be formed over the metallic grid 120 including the metal framework 122. Both the metallic grid 120 and the metal layer 216 have one or more openings 124. The color filters 204 are positioned in the openings 124.

Figure 3:
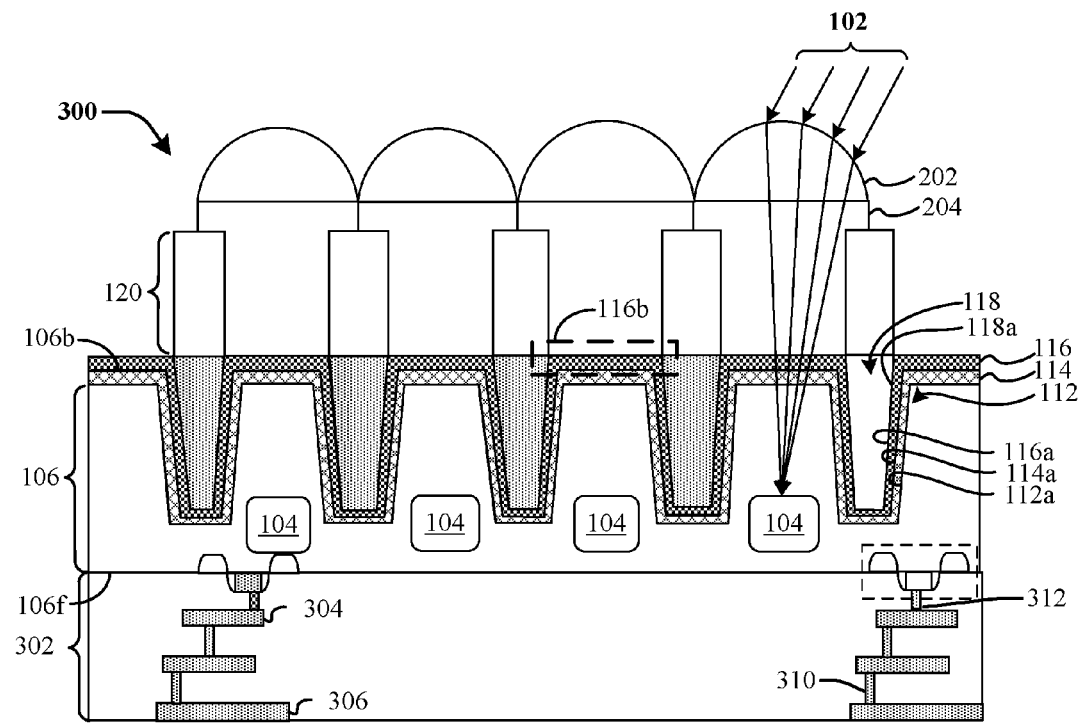
FIG. 3 illustrates a cross-sectional view of a backside illuminated (BSI) embodiment of the CMOS image sensor of FIG. 1.

FIG. 3 illustrates a cross-sectional view of a backside illuminated (BSI) embodiment of the CMOS image sensor 300 of FIG. 1. In a BSI embodiment, a metallic grid 120 is arranged along a back-side 106b of a sensing device substrate 106. Transistor devices 314 are arranged along a front-side 106f of the sensing device substrate 106. The transistor devices 314 comprise source and/or drain regions separated by a gate region over the front-side 106f of the sensing device substrate 106.

An interconnect structure 302 underlies the sensing device substrate 106 having the image sensing devices 104. The interconnect structure 302 includes metal interconnect layers such as a lowermost metal layer 304 spaced at a first distance from the sensing device substrate 106, and an uppermost metal layer 306 spaced at a second distance from the sensing device substrate 106. The second distance is greater than the first distance. Contacts 312 couple the lowermost metal layer 304 to device regions (e.g., transistor devices). The metal interconnect layers are arranged within a dielectric structure having a plurality of inter-dielectric (ILD) layers. In various embodiments, the ILD layers may be, for example, a low κ dielectric, oxide, or silicon oxide. The metal interconnect layers, such as the lowermost metal layer 304 and the uppermost metal layer 306, are connected by vias 310. The metal interconnect layers and vias may be, for example, a metal, such as aluminum, copper, or tungsten, or a copper aluminum compound.

Figure 4:
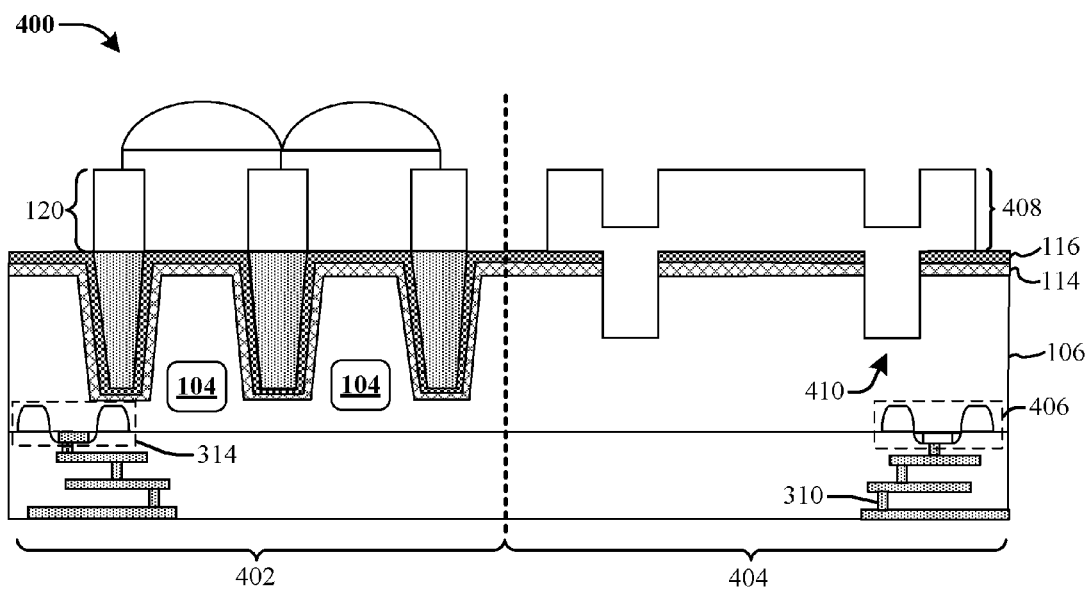
FIG. 4 illustrates some embodiments of a cross-sectional view of a CMOS image sensor of FIG. 1 having a periphery region.

FIG. 4 illustrates a cross-sectional view of a CMOS image sensor of FIG. 1 having a periphery region. In one embodiment, the CMOS sensor 400 includes an image sensor region 402 and a periphery region 404. The image sensor region 402 comprises a plurality of image sensing device 104 arranged within a sensing device substrate 106. The periphery region 404 comprises a plurality of semiconductor devices 406. The plurality of semiconductor devices 406 may comprise transistor devices configured to perform image processing of signals generated by image sensing devices 104 within the image sensor region 402. For example, the periphery region 404 may comprise one or more transistor devices configured to operate as filters, analog-to-digital converters, etc.

The periphery region 404 further include a metallic blocking layer 408 arranged over the high k structure 114 at a location offset from the metallic grid 120. The metallic blocking layer 408 is configured to block incident radiation from reaching the one or more semiconductor devices 406 within the periphery region 404. In some embodiments, the metallic blocking layer 408 and the metallic grid 120 may comprise a same material (e.g., tungsten, aluminum, titanium, etc.). The metal blocking layer 408 is separated from high k structure 114 by the passivation layer 116. The passivation layer 116 within the periphery region 404 has an upper surface that is coplanar with an upper surface of the passivation layer overlying the plurality of image sensing devices 104. In some embodiments, the metallic blocking layer 408 may comprise one or more protrusions 410 extending through the passivation layer 116 and the high k structure 114 to contact the sensing device substrate 106. The one or more protrusions 410 are configured to electrically ground the blocking layer 408.

FIGS. 5-13 illustrate a series of cross-sectional views of some embodiments of a method for manufacturing a CMOS image sensor.

Figure 5:
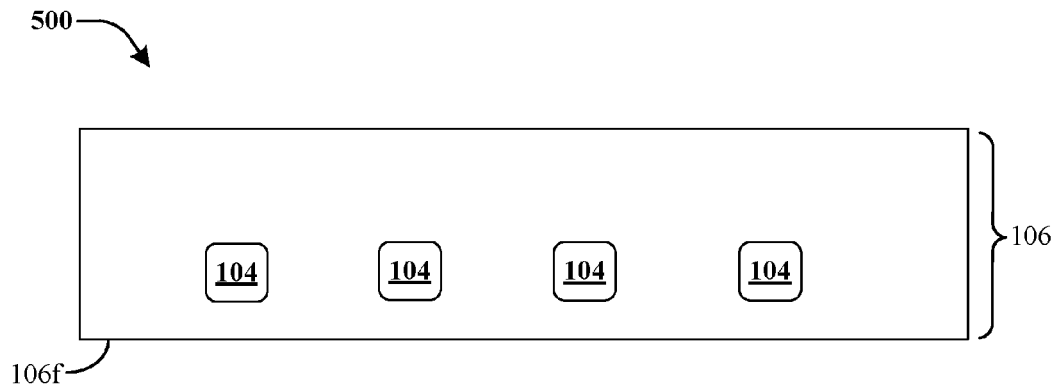
FIGS. 5-13 illustrate a series of cross-sectional views of some embodiments of a method for manufacturing the CMOS image sensor.

In cross-sectional view 500 of FIG. 5, image sensing devices 104 are formed within a sensing device substrate 106. In some embodiments, the image sensing devices 104 may comprise photodiodes formed by selectively implanting one or more dopant species into a front-side 106f of the sensing device substrate 106. In some embodiments, the sensing device substrate 106 can be a bulk silicon substrate or a semiconductor-on-insulator (SOI) substrate (e.g., silicon on insulator substrate) in the form of a disc-like wafer. The sensing device substrate 106 may also be a binary semiconductor substrate (e.g., GaAs), a tertiary semiconductor substrate (e.g., AlGaAs), a higher order semiconductor substrate, or even a sapphire substrate. The sensing device substrate 106 can include doped regions formed in or on the substrate, epitaxial layers formed in or on the substrate, insulating layers formed in or on the substrate, photoresist layers formed in or on the sensing device substrate 106, and/or conducting layers formed in or on the sensing device substrate 106.

Figure 6:
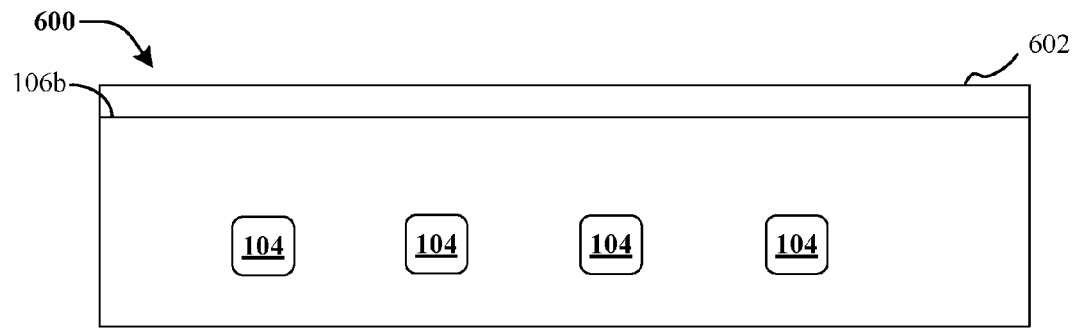

In cross-sectional view 600 of FIG. 6, a first photoresist layer 602 is formed over the sensing device substrate 106. In some embodiments, the first photoresist layer 602 may be formed over a back-side 106b of the sensing device substrate 106 by a spin coating process. The first photoresist layer 602 is subsequently patterned using a lithography process to define one or more openings.

Figure 7:
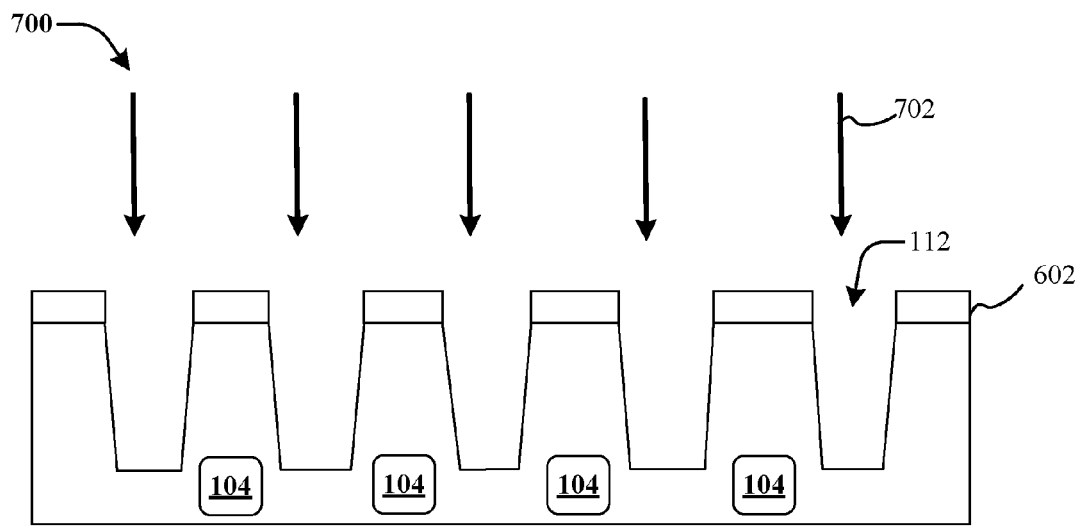

In cross-sectional view 700 of FIG. 7 trenches 112 are formed in the sensing device substrate 106. In some embodiments, the trenches 112 may be formed by exposing the sensing device substrate 106 to a first etchant 702, while using the first photoresist layer 602 as a mask. After forming the trenches 112, the first photoresist layer 602 is removed. The trenches 112 are formed at locations laterally removed from the image sensing devices 104.

Figure 8:
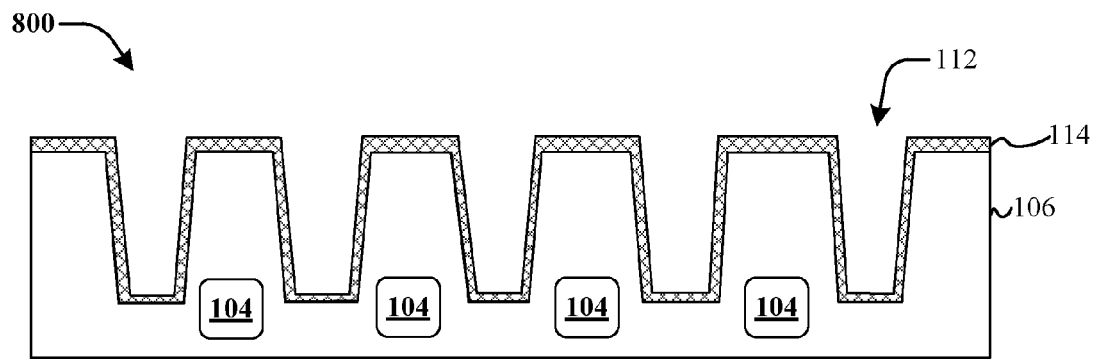

In cross-sectional view 800 of FIG. 8, a high κ structure 114 is deposited over the sensing device substrate 106. The high κ structure 114 lines the sidewalls and lower surfaces of the trenches 112. The high κ structure 114 may be deposited by vapor deposition, such as chemical vapor deposition (CVD) or physical vapor deposition (PVD), or grown by thermal oxidation. In some embodiments, the high κ structure 114 may include a plurality of layers. For example, the high κ structure 114 may include a first high κ dielectric layer, a second high κ dielectric layer arranged below the first high κ dielectric layer, and an oxide layer arranged below the second high κ dielectric layer. Accordingly, the deposition process may include a plurality of depositions. In some embodiments, the first high κ dielectric layer may be deposited to a thickness in a range of between approximately 50-200 angstroms, the second high κ dielectric layer may be deposited to a thickness in a range of between approximately 400-600 angstroms, and the oxide layer may be formed to a thickness of 5-50 angstroms. In some embodiments, the oxide layer may be formed using a plasma generated by a slot plane antenna.

Figure 9:
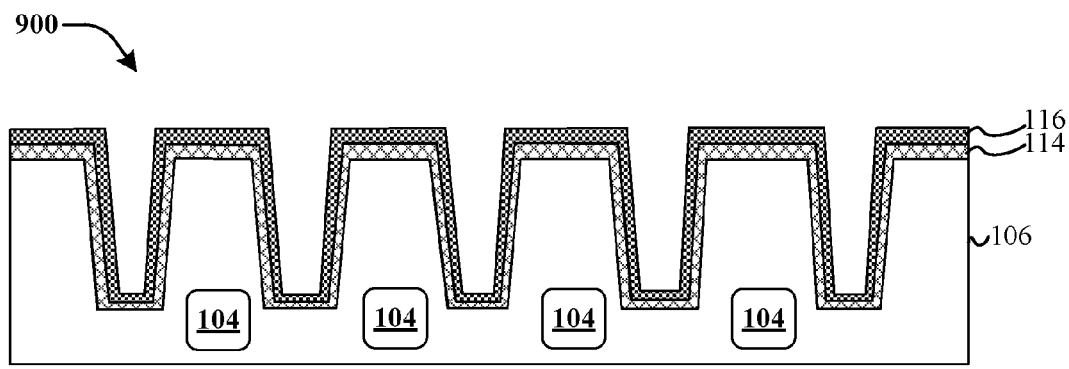

In cross-sectional view 900 of FIG. 9, a passivation layer 116 is deposited over the high κ structure 114. The passivation layer 116 lines the sidewalls and lower surfaces of the high κ structure 114. The passivation layer 116 may be deposited by vapor deposition, such as chemical vapor deposition (CVD) or physical vapor deposition (PVD), or grown by thermal oxidation. In some embodiments, the passivation layer 116 may comprise an oxide or a nitride (e.g., silicon nitride) formed by a vapor deposition process (e.g., PVD, CVD, PE-CVD, ALD, etc.).

Figure 10:
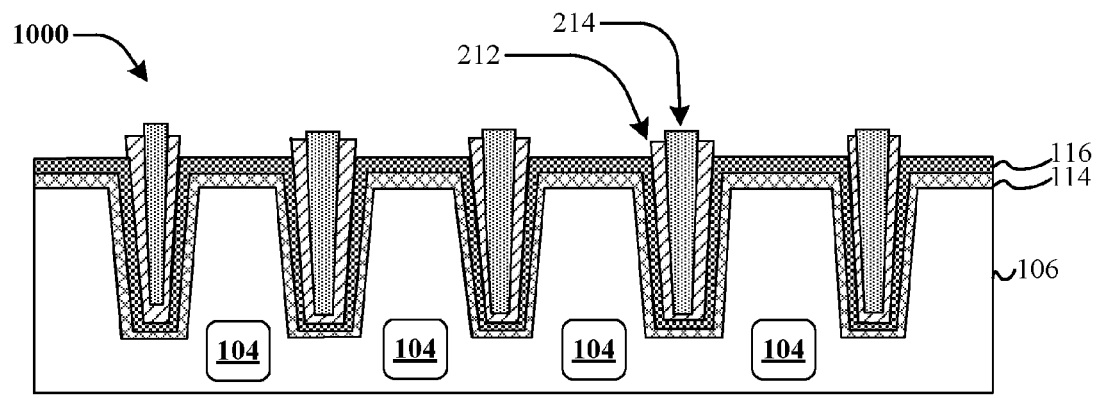

In cross-sectional view 1000 of FIG. 10, the trenches 112 are filled with isolation material. The isolation material is deposited to fill the area of the trenches not filled by the high κ structure 114 and the passivation layer 116. In some embodiments, the isolation structure 118 may have a layered structure. For example, the isolation structure may include an oxide shell 212 that surrounds a metallic core 214. In one embodiment, the oxide shell 212 and the metallic core 214 have upper surfaces that are coplanar. In another embodiment, the oxide shell 212 surrounds the metallic core 214. For example, after forming the metallic core 214, a first oxide layer of the oxide shell 212 and the metallic core 214 are etched to form a recess in the metallic core 214 and first oxide layer relative to the passivation layer 116. Then a subsequent second oxide layer could be formed over the top of the metallic core 214 and the first oxide layer.

Figure 11:
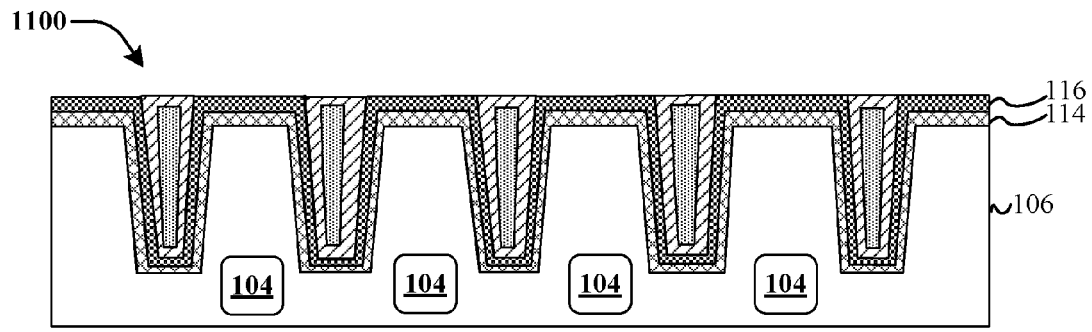

In cross-sectional view 1100 of FIG. 11, chemical mechanical planarization (CMP) is performed to form a planar surface along the passivation layer 116 and the oxide shell 212 and/or the metallic core 214. The passivation layer 116 may be able to stop chemical mechanical planarization (CMP) without necessitating a thick buffer oxide layer.

Figure 12:
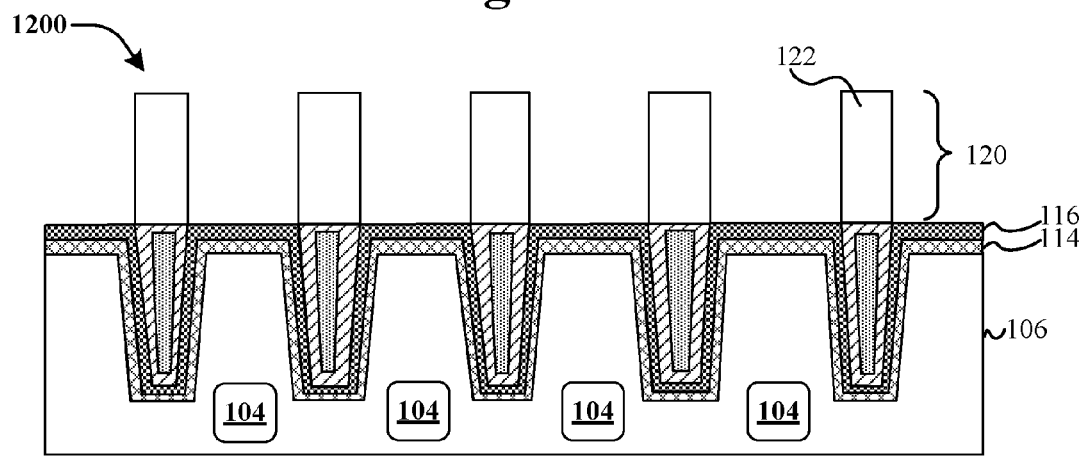

As shown in cross-sectional view 1200 of FIG. 12, a metallic grid 120 is formed over the upper surface of the passivation layer 116. The dielectric and metal are then selectively etched to define one or more openings within the metallic grid 120.

Figure 13:
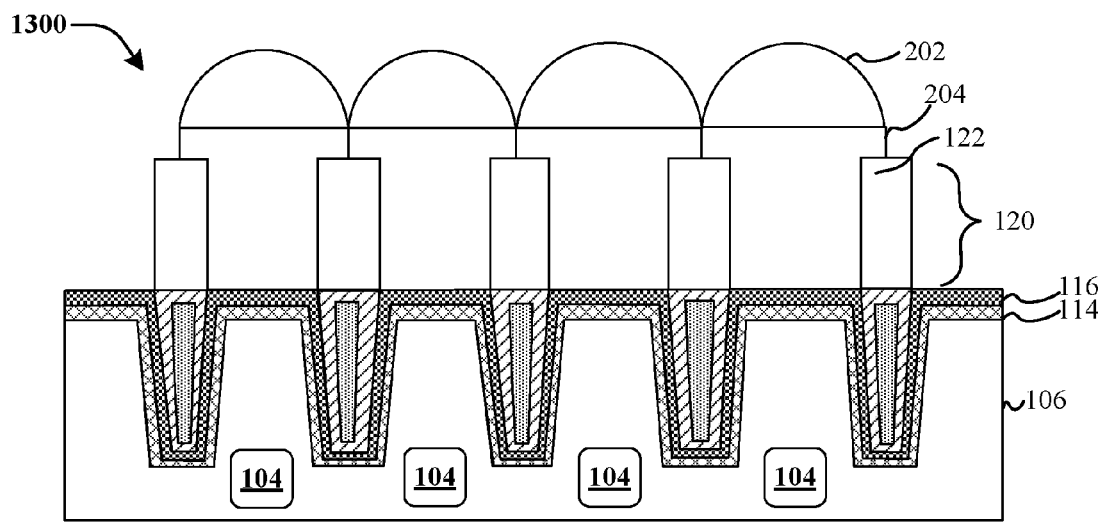

In cross-sectional view 1300 of FIG. 13, a plurality of color filters 204 are then formed to fill the openings of the metallic grid. In some embodiments, the plurality of color filters 204 may be formed by forming a color filter layer to fill the openings 124 and then patterning the color filter layer. The color filter layer is formed of a material that allows for the transmission of radiation (e.g., light) having a specific range of wavelength, while blocking light of wavelengths outside of the specified range.

A plurality of microlenses 202 are formed over the plurality of color filters 204. In some embodiments, the microlenses 202 may be formed by depositing a micro-lens material above the plurality of color filters 204 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The microlenses 202 are then formed by selectively etching the micro-lens material according to the micro-lens template.

Figure 14:
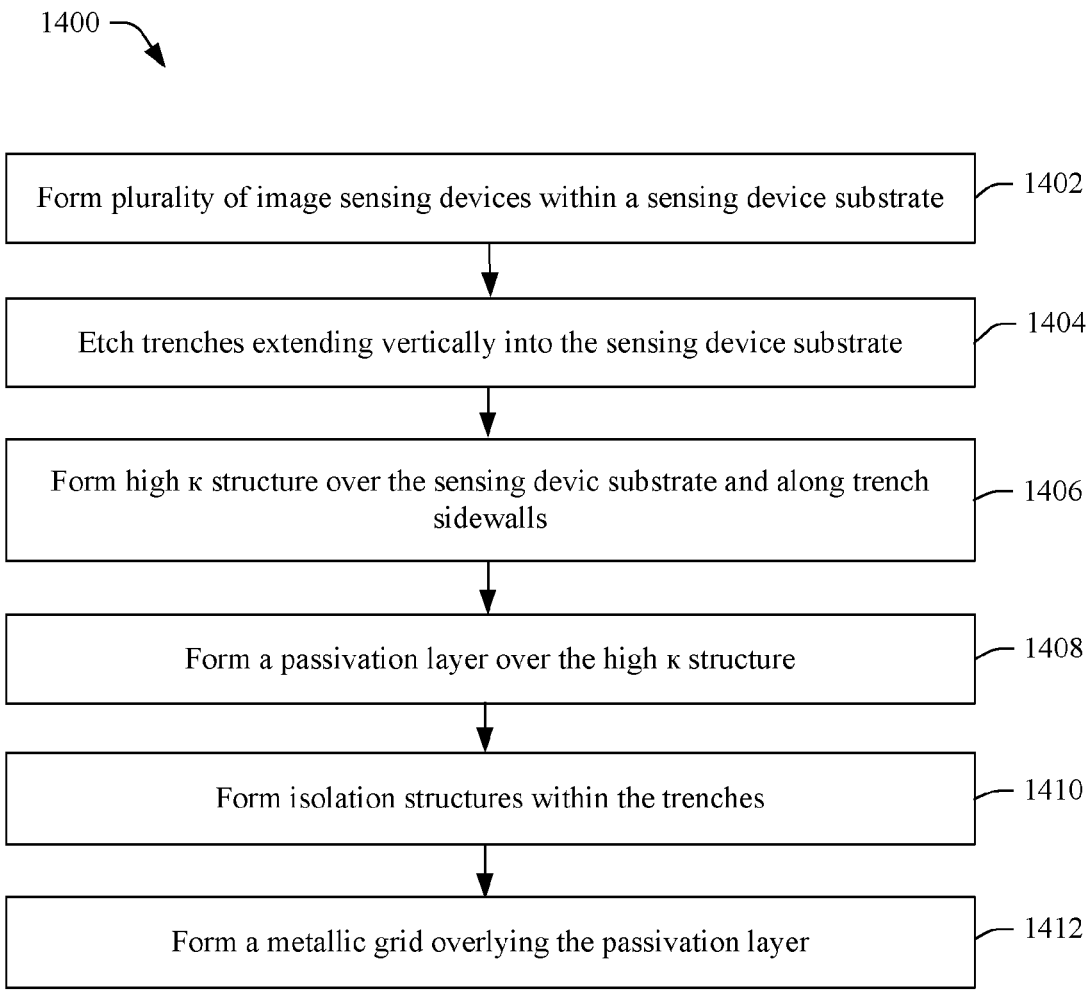
FIG. 14 illustrates a flowchart of some embodiments of a method for manufacturing a CMOS image sensor.

FIG. 14 illustrates a flowchart of some embodiments of a method for manufacturing a CMOS image sensor in accordance with FIG. 1. With reference to FIG. 14, a flowchart 1400 of some embodiments of a method for manufacturing a CMOS image sensor having a passivation layer.

At 1402, a plurality of image sensing devices are formed within a sensing device substrate. FIG. 5 illustrates some embodiments of a cross-sectional view corresponding to act 1402.

At 1404, trenches are etched to vertically extend into the sensing device substrate at location surrounding the plurality of image sensing devices. FIGS. 6-7 illustrates some embodiments of cross-sectional views corresponding to act 1404. The trenches have trench sidewalls in the sensing device substrate.

At 1406, a high κ structure is formed over sensing device substrate and into the trench sidewalls. FIG. 8 illustrates some embodiments of a cross-sectional view corresponding to act 1406. In some embodiments the high κ structure may have multiple high κ layers having different dielectric constants.

At 1408, a passivation layer is formed over the high κ structure and within the trenches. FIG. 9 illustrates some embodiments of a cross-sectional view corresponding to act 1408.

At 1410, isolation structures are formed within the trenches and over the passivation layer. FIG. 10 illustrates some embodiments of a cross-sectional view corresponding to act 1402. In some embodiments, the isolation structures may be layered.

At 1412, a metallic grid is formed overlying the passivation layer. The metallic grid has openings that overlie the plurality of image sensing devices. FIG. 12 illustrates some embodiments of a cross-sectional view corresponding to act 1402. Additionally, a plurality of color filters may then be formed to fill the openings of the metallic grid. A plurality of microlenses may be formed over the color filters.

While the method described by the flowchart 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, in some embodiments, the present disclosure provides a passivation layer of a passivation material. The passivation layer replaces a thicker buffer oxide layer. Unlike the thicker buffer oxide layer, the passivation layer is able to stop CMP with a thinner layer. A thinner passivation layer results in thinner CMOS image sensor, and thereby a shorter optical path length for incident radiation.

In some embodiments, a CMOS image sensor includes a sensing device substrate. Isolation structures are positioned within trenches of the sensing device substrate. The isolation structures are arranged along opposing sides of a plurality of image sensing devices. The CMOS image sensor also includes a passivation layer. The passivation layer includes passivation sidewalls arranged along the sidewalls of the isolation structures. A metallic grid overlies the passivation layer. The metallic grid includes a metal framework surrounding openings overlying the plurality of image sensing devices. The passivation layer further includes passivation section underlying the openings.

In some embodiments, a CMOS image sensor includes a sensing device substrate having a plurality of image sensing devices. A high κ structure is disposed over a first side of the sensing device substrate. Isolation structures extend from an upper surface of the high κ structure to within the substrate along opposing sides of the plurality of image sensing devices. A silicon nitride layer is arranged over the high κ structure. A metallic grid overlies the plurality of isolation structures. The metallic grid comprises a plurality of openings. The opening overlying one of the plurality of image sensing devices.

The described embodiments also includes a method of forming a CMOS image sensor. The method includes forming a plurality of image sensing devices within a sensing device substrate. Trenches are etched to vertically extend into the sensing device substrate at location surrounding the plurality of image sensing devices. A high κ structure is formed over sensing device substrate and into the trench sidewalls. The method also includes depositing a passivation layer is deposited over the high κ structure and within the trenches. Isolation structures are formed within the trenches and over the passivation layer. A metallic grid is formed to overlie the passivation layer. The metallic grid includes openings overlying the plurality of image sensing devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A complementary metal-oxide-semiconductor (CMOS) image sensor comprising:
    a sensing device substrate;
    a high κ structure having a first high κ dielectric layer, a second high κ dielectric layer, and an oxide, wherein a first dielectric constant of the first high κ dielectric layer is different than a second dielectric constant of the second high κ dielectric layer;
    isolation structures positioned within trenches in the high κ structure;
    a passivation layer, wherein the passivation layer includes passivation sidewalls arranged along sidewalls of the isolation structures; and
    a metallic grid overlying the passivation layer, wherein the metallic grid includes a metal framework surrounding openings overlying a plurality of image sensing devices, and wherein the passivation layer further includes passivation sections underlying the openings.

2. The CMOS image sensor of claim 1, wherein the passivation sections abut the openings.

3. The CMOS image sensor of claim 1, wherein the passivation sidewalls abut the sidewalls of the isolation structures.

4. The CMOS image sensor of claim 1, wherein the metal framework contacts the isolation structures.

5. The CMOS image sensor of claim 1, wherein the isolation structures have upper surfaces that are coplanar with upper surfaces of the passivation layer.

6. The CMOS image sensor of claim 1, wherein the image sensing device comprises a photodiode disposed within the sensing device substrate, wherein the photodiode is arranged between two isolation structures.

7. The CMOS image sensor of claim 1, wherein the passivation layer is comprised of silicon nitride.

8. The CMOS image sensor of claim 1, wherein the passivation layer has a thickness that is less than or equal to approximately 500 angstroms.

9. A complementary metal-oxide-semiconductor (CMOS) image sensor comprising:
    a plurality of image sensing devices arranged within a sensing device substrate;
    a high κ structure disposed over a first side of the sensing device substrate, the high κ structure having:
        a first high κ dielectric layer arranged over the sensing device substrate, and
        a second high κ dielectric layer arranged over the first high κ dielectric layer, wherein a first dielectric constant of the first high κ dielectric layer is different than a second dielectric constant of the second high κ dielectric layer;
    a plurality of isolation structures extending from an upper surface of the high κ structure to within the sensing device substrate along opposing sides of the plurality of image sensing devices;
    a silicon nitride layer arranged over the high κ structure; and
    a metallic grid overlying the plurality of isolation structures, wherein the metallic grid comprises a plurality of openings, respectively overlying one of the plurality of image sensing devices.

10. The CMOS image sensor of claim 9, wherein the silicon nitride layer contacts the first high κ dielectric layer.

11. The CMOS image sensor of claim 9, wherein the silicon nitride layer abuts sidewalls and lower surfaces of the plurality of isolation structures.

12. The CMOS image sensor of claim 9, further comprising:
    a plurality of transistor devices arranged along a second side of the sensing device substrate and operably coupled to the plurality of image sensing devices; and
    a plurality of metal interconnect layers arranged within a dielectric structure disposed along the second side of the sensing device substrate.

13. The CMOS image sensor of claim 9, further comprising:
    a periphery region comprising a metallic blocking layer arranged over the high k structure at location offset from the metallic grid.

14. The CMOS image sensor of claim 9, wherein an upper surface of the silicon nitride layer is arranged below a lower surface of the metallic grid.

15. The CMOS image sensor of claim 9, wherein the high κ structure further includes an oxide arranged over the second high κ dielectric layer.

16. The CMOS image sensor of claim 13, wherein the silicon nitride layer within the periphery region has an upper surface that is coplanar with an upper surface of the silicon nitride layer overlying the plurality of image sensing devices.

17. A complementary metal-oxide-semiconductor (CMOS) image sensor comprising:
    a sensing device substrate having trenches extending vertically into the sensing device substrate at locations surrounding a plurality of image sensing devices, wherein the trenches have trench sidewalls;
    a high κ structure arranged over the sensing device substrate that conforms to the trench sidewalls, the high κ structure having:
        a first high κ dielectric layer; and
        a second high κ dielectric layer arranged over and contacting the first high κ dielectric layer;
    a passivation layer arranged over and in contact with the high κ structure, wherein the passivation layer contacts the first high κ dielectric layer;
    isolation structures arranged within the trenches and over the passivation layer; and
    a metallic grid overlying the passivation layer, wherein the metallic grid comprises openings overlying the plurality of image sensing devices.

18. The CMOS image sensor of claim 17, wherein the passivation layer has a thickness that is less than or equal to approximately 500 angstroms.

19. The CMOS image sensor of claim 17, wherein the passivation layer abuts sidewalls and lower surfaces of the isolation structures.

20. The CMOS image sensor of claim 17, wherein a first dielectric constant of the first high κ dielectric layer is different than a second dielectric constant of the second high κ dielectric layer.

\* \* \* \* \*